US006625990B2

United States Patent
Bell

(12) United States Patent
(10) Patent No.: US 6,625,990 B2
(45) Date of Patent: Sep. 30, 2003

(54) THERMOELECTRIC POWER GENERATION SYSTEMS

(75) Inventor: Lon E. Bell, Irwindale, CA (US)

(73) Assignee: BSST LLC, Irwindale, CA (US)

( * ) Notice: Subject to any disclaimer, the term of this patent is extended or adjusted under 35 U.S.C. 154(b) by 0 days.

(21) Appl. No.: 10/164,656

(22) Filed: Jun. 6, 2002

(65) Prior Publication Data

US 2002/0148236 A1 Oct. 17, 2002

Related U.S. Application Data

(63) Continuation-in-part of application No. 10/074,543, filed on Feb. 11, 2002, and a continuation-in-part of application No. 09/971,539, filed on Oct. 2, 2001, and a continuation-in-part of application No. 09/918,999, filed on Jul. 31, 2001, and a continuation-in-part of application No. 09/844,818, filed on Apr. 27, 2001.

(60) Provisional application No. 60/267,657, filed on Feb. 9, 2001.

(51) Int. Cl.$^7$ .......................... F25B 21/02; H01L 35/28

(52) U.S. Cl. ............................ 62/3.3; 62/3.2; 136/212; 136/205

(58) Field of Search ............................ 62/3.3, 3.7, 3.2; 136/204, 205, 203, 208, 209, 210, 212

(56) References Cited

U.S. PATENT DOCUMENTS

| | | | |
|---|---|---|---|
| 3,635,037 | A | 1/1972 | Hubert |
| 3,681,929 | A | 8/1972 | Schering |
| 3,779,814 | A | 12/1973 | Miles et al. |
| 4,065,936 | A | 1/1978 | Fenton et al. |
| 4,730,459 | A | 3/1988 | Schlicklin et al. |
| 5,092,129 | A | 3/1992 | Bayes et al. |
| 5,228,923 | A | 7/1993 | Hed |
| 5,232,516 | A | 8/1993 | Hed |
| 5,802,856 | A | 9/1998 | Schaper et al. |
| 6,084,172 | A | 7/2000 | Kishi et al. |
| 6,334,311 | B1 | 1/2002 | Kim et al. |
| 6,346,668 | B1 | 2/2002 | McGrew |
| 6,347,521 | B1 | 2/2002 | Kadotani et al. |

OTHER PUBLICATIONS

A New Concept of Porous Thermoelectric Module Using a Reciprocating Flow for Cooling/Heating System (Numerical Analysis for Heating System), Shigeru Tada, Ryozo Echigo and Hideo Yoshida, 16$^{th}$ International Conference on Thermoelectric (1997).

International Search Report for PCT/US 02/03654 dated Jun. 12, 2002.

H.J. Goldsmid, *Electronic Refrigeration*, Pion Ltd, 207 Brondesbury Park, London (1986).

Stanley W. Angrist, *Direct Energy Conversion*, 32 Ed. Ally & Bacon (1976).

International Search Report for PCT/US 02/06285 dated Jun. 12, 2002.

A New Concept for Improving Thermoelectric Heat Pump Efficiency, R.J. Buist, J.W. Fenton and J.S. Lee, BorgWarner Thermoelectrics Wolf and Algonquin Road.

*Primary Examiner*—Chen Wen Jiang
(74) *Attorney, Agent, or Firm*—Knobbe, Martens, Olson & Bear LLP

(57) ABSTRACT

An improved thermoelectric power generation system utilizes rotary thermoelectric configurations to improve and increase thermal power throughput. These systems are further enhanced by the use of hetrostructure thermoelectric materials, very thin plated materials, and deposited thermoelectric materials, which operate at substantially higher power densities than typical of the previous bulk materials. Several configurations are disclosed.

43 Claims, 11 Drawing Sheets

THERMOELECTRIC POWER GENERATION SYSTEMS

PRIOR RELATED PROVISIONAL AND PATENT APPLICATIONS

This Application is related to and claims the benefit of the filing date of prior filed U.S. Provisional Patent Application No. 60/267,657, file Feb. 9, 2001. This application is a continuation-in-part of U.S. patent application Ser. No. 10/074,543, filed Feb. 11, 2002, and a continuation-in-part of U.S. patent application Ser. No. 09/971,539 filed Oct. 2, 2001, and a continuation-in-part of U.S. patent application Ser. No. 09/918,999, filed Jul. 31, 2001 and a continuation-in-part of U.S. patent application Ser. No. 09/844,818 filed Apr. 27, 2001.

BACKGROUND OF THE INVENTION

1. Field of the Invention

The present invention relates to the field of power generation using thermoelectric devices.

2. Description of the Related Art

Although it has long been understood that thermoelectric devices can be used to generate power, thermoelectric power generation has been little utilized because the efficiency of present generator design and the power density of such generators are too low.

Historically, solid-state electrical power generating systems are constructed from TE Modules or stand-alone TE elements placed between a source of heat and a heat sink. The parts are designed with no moving parts in the power generator its self. Generally, systems that use hot and cold working fluids as the hot and cold sources employ fans to transport the fluids to the assembly.

In other applications, pressurized air and fuel are combusted within the generator. Still in other applications, such as automotive exhaust waste power converters, heat is transported to the generator by the exhaust system. In these devices, the waste heat is removed either by external fans supplying coolant or by free convection through finned radiators.

In applications such as generators that employ nuclear isotopes as the heat source, individual TE elements are configured to produce electrical power. Each TE element is attached to an isotope heat source on the hot side, and to a waste heat radiator on the cold side. No parts move during operation.

SUMMARY OF THE INVENTION

New hetrostructure thermoelectric, quantum tunneling, very thin plated, and deposited thermoelectric materials operate at substantially higher power densities than typical of the previous bulk materials and offer the potential for higher system efficiency.

Successful operation of thermoelectric devices with high power density requires high heat transfer rates both on the cold and hot side of TE Modules. One way to achieve this is through rotary designs that lend themselves to high fluid flow rates, and hence, high thermal power throughput. In one preferred embodiment, rotary systems in which a portion of the heat exchanger acts as fan blades, and thereby contributes to working fluid flow, can reduce power into the fan, simplify system design and reduce size.

Further, the heat transfer rate in many systems can be increased by employing heat pipes, as is well known to the art. Such devices use two-phase (liquid and vapor) flow to transport heat content from one surface to another. Where heat is to be removed at a heat source surface, the fluids' heat of vaporization is utilized to extract thermal power. The vapor flows to a surface at a lower temperature at the heat sink side where it condenses and thus gives up its heat of vaporization. The condensed fluid returns to the heat source side by capillary action and/or gravity.

Properly designed heat pipes are very efficient and transport large thermal fluxes with very low temperature differential. Some keys to efficient operation are that the liquid return process be efficient and that the entire heat source side be wetted at all times, to make liquid always available to evaporate and carry away thermal power. Similarly, it is important that the cool, sink side does not accumulate liquid since heat pipe working fluids are usually relatively poor thermal conductors. Thus, the sink side should shed liquid efficiently, to maintain effective thermal conductance surface.

In one embodiment, discussed herein, properly oriented heat pipes are combined with rotating heat exchange members, to utilize the centrifugal forces induced by rotation of the heat exchangers to improve performance. Rotary acceleration produced by fans and pumps can be up to several thousand Gs, so that with proper design, the liquid phase can be transported from the heat sink side to the heat source side very efficiently. Designs in which the colder end is closer to the axis of rotation than the hotter end, can exhibit very desirable heat transport properties because the centrifugal forces advantageously increase liquid phase flow when. As a result, such designs have increased power density, and reduced losses.

Finally, power generators that are combined with thermal isolation as described in U.S. patent application Ser. No. 09/844,818, entitled Improved Efficiency Thermoelectrics Utilizing Thermal Isolation can further increase performance.

One aspect described involves a thermoelectric power generator having at least one rotary thermoelectric assembly that has at least one thermoelectric module. The at least one rotary thermoelectric assembly accepts at least one working fluid and converts heat from the working fluid into electricity. Advantageously, the at least one rotary thermoelectric assembly comprises at least one hotter side heat exchanger and at least one cooler side heat exchanger. In one embodiment, the at least one hotter side heat exchanger has at least one hotter side heat pipe in thermal communication with the at least one thermoelectric module and a plurality of heat exchanger fins in thermal communication with the at least one hotter side heat pipe. In one embodiment, the at least one cooler side heat exchanger has at least one cooler side heat pipe in thermal communication with the at least one thermoelectric module and a plurality of heat exchanger fins in thermal communication with the at least one cooler side heat pipe. In one embodiment, the least one working fluid is at least one hotter and at least one cooler working fluid.

Preferably, the heat pipes contain a fluid, and the heat pipes are oriented such that centrifugal force from the rotation of the rotary thermoelectric assembly causes a liquid phase of the fluid to gather in a portion in said heat pipes. For example, the fluid in the cooler side heat pipes is in a liquid phase at at least a portion of an interface to the at least one thermoelectric module, and the fluid in the hotter side heat pipes is in a vapor phase at at least a portion of an interface to the at least one thermoelectric module.

In one embodiment, a motor coupled to the at least one rotary thermoelectric assembly spins the at least one rotary thermoelectric assembly. In another embodiment, the least one working fluid spins the at least one thermoelectric assembly. Preferably, the spinning pumps the working fluid through or across the heat exchangers, or both through and across the beat exchangers.

In one preferred embodiment, the at least one rotary thermoelectric assembly has a plurality of thermoelectric modules, at least some of the thermoelectric modules thermally isolated from at least some other of the thermoelectric modules. In another embodiment, the at least one hotter side heat exchanger has a plurality of portions substantially thermally isolated from other portions of the hotter side heat exchanger.

Another aspect described herein involves a method of generating power with at least one thermoelectric assembly having at least one thermoelectric module. The method involves rotating the at least one thermoelectric assembly, passing at least one first working fluid through and/or past a first side of the at least one thermoelectric assembly to create a temperature gradient across the at least one thermoelectric module to generate electricity, and communicating the electricity from the at least one thermoelectric module. In one embodiment, the method also involves passing at least one second working fluid through and/or past a second side of the at least one thermoelectric assembly. The rotation may be obtained in any number of ways, such as with a motor, with the working fluid itself, and in any other feasible manner to spin the thermoelectric assembly.

Preferably, the at least one thermoelectric assembly has at least one first side heat exchanger and at least one second side heat exchanger, and the step of passing the at least one first working fluid involves passing the at least one first working fluid through and/or past the first and/or second side heat exchanger.

As with the apparatus, in one embodiment, the at least the at least one first side heat exchanger has at least one first side heat pipe in thermal communication with the at least one thermoelectric module and a plurality of heat exchanger fins in thermal communication with the at least one first side heat pipe. Advantageously, the heat pipes contain a fluid and are oriented such that centrifugal force from the rotation of the at least one thermoelectric assembly causes a liquid phase of said fluid to gather in a portion in said heat pipes. The configurations for this method are as with the apparatus.

Another aspect described involves a thermoelectric power generation system having a source of at least one hotter working fluid, a source of at least one cooler working fluid, and at least one rotary thermoelectric assembly having at least one thermoelectric module, wherein the rotary thermoelectric assembly accepts the at least one hotter working fluid and converts heat from the hotter working fluid into electricity. Preferably, the system also has an exhaust for the at least one hotter and the at least one cooler working fluids, and at least one electrical communication system to transfer electricity from the rotary thermoelectric assembly.

In one embodiment, the at least one rotary thermoelectric assembly comprises at least one hotter side heat exchanger and at least one cooler side heat exchanger. As with the previous method and apparatus discussion, in one embodiment, at least the at least one hotter side heat exchanger has at least one hotter side heat pipe in thermal communication with the at least one thermoelectric module and a plurality of heat exchanger fins in thermal communication with the at least one hotter side heat pipe. Similarly, in one embodiment, at least the at least one cooler side heat exchanger may have at least one cooler side heat pipe in thermal communication with the at least one thermoelectric module and a plurality of heat exchanger fins in thermal communication with the at least one cooler side heat pipe. Thermal isolation may also be utilized.

These and other aspects and benefits of the present description will be apparent from the more detailed description of the preferred embodiments below.

DETAILED DESCRIPTION OF THE PREFERRED EMBODIMENT

In the context of this description, the term Thermoelectric Module or TE Module are used in the broad sense of their ordinary and customary meaning, which is (1) conventional thermoelectric modules, such as those produced by Hi Z Technologies, Inc. of San Diego, Calif., (2) quantum tunneling converters (3) thermoionic modules, (4) magneto caloric modules, (5) elements utilizing one, or any by combination of, thermoelectric, magneto caloric, quantum, tunneling and thermoionic effects, (6),) any combination, array, assembly and other structure of (1) through (6) above.

In this description, the words cold, hot, cooler, hotter and the like are relative terms, and do not signify a temperature range. For instance, the cold side heat exchanger may actually be very hot to the human touch, but still cooler than the hot side. These terms are merely used to signify that a temperature gradient exists across the TE Module.

In addition, the embodiments described in this application are merely examples, and are not restrictive to the invention, which is as defined in the claims.

Figure 1A:
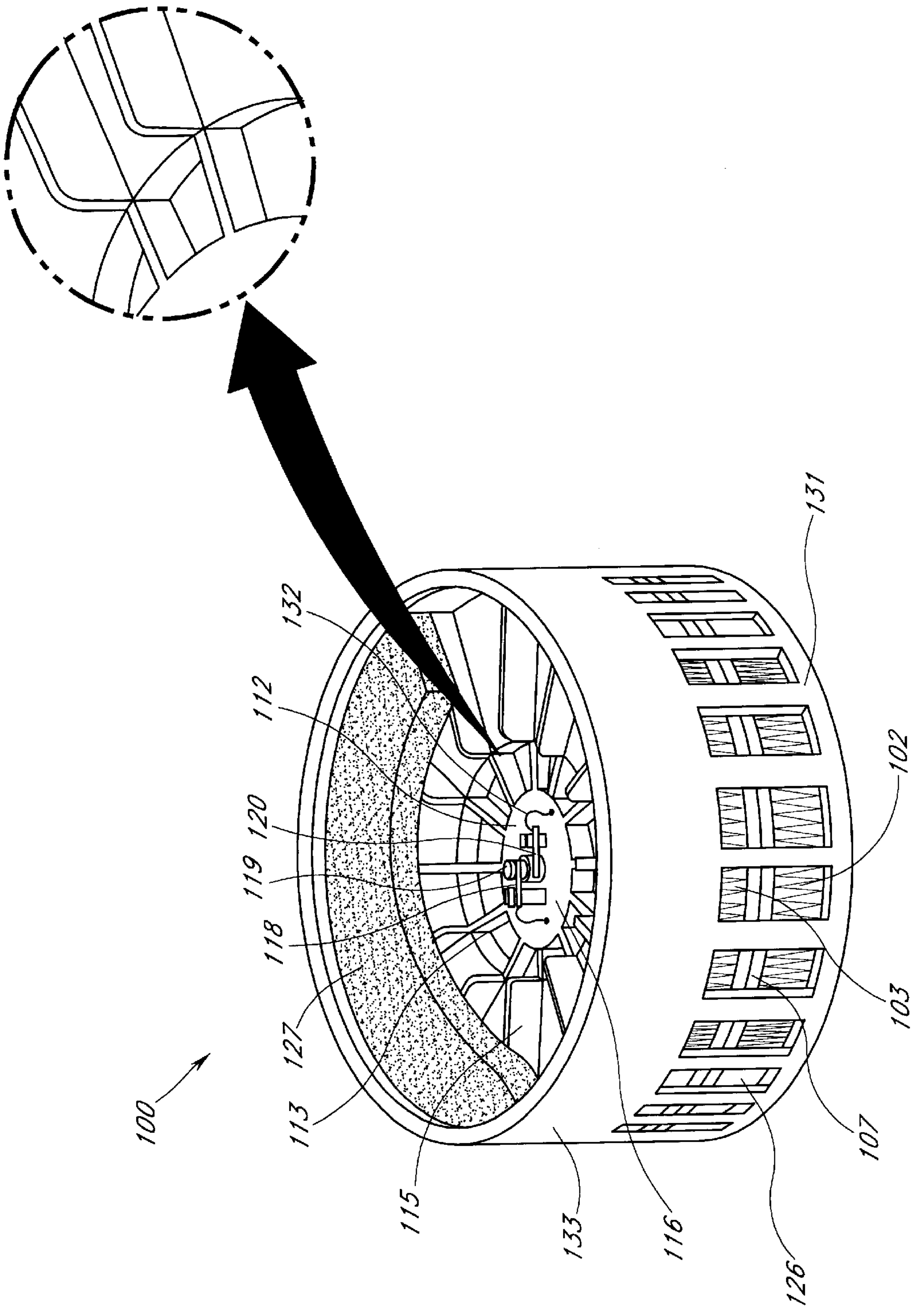
FIGS. 1A–1C depict a general arrangement of a thermoelectric generator that hot and cold fluids a motor and heat exchanger fins to create a temperature differential across a TE Module. Electrical power is produced from the thermal power within the hot side fluid stream.
Figure 1B:
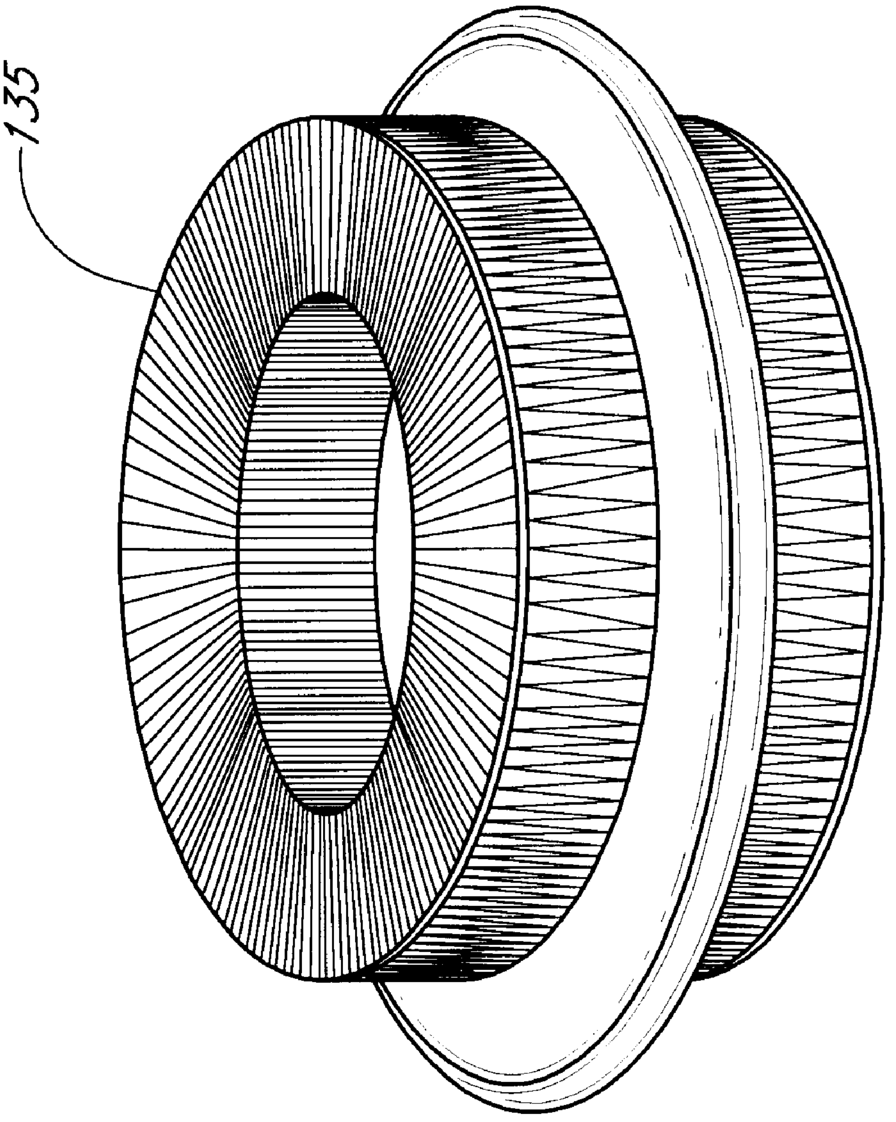
Figure 1C:
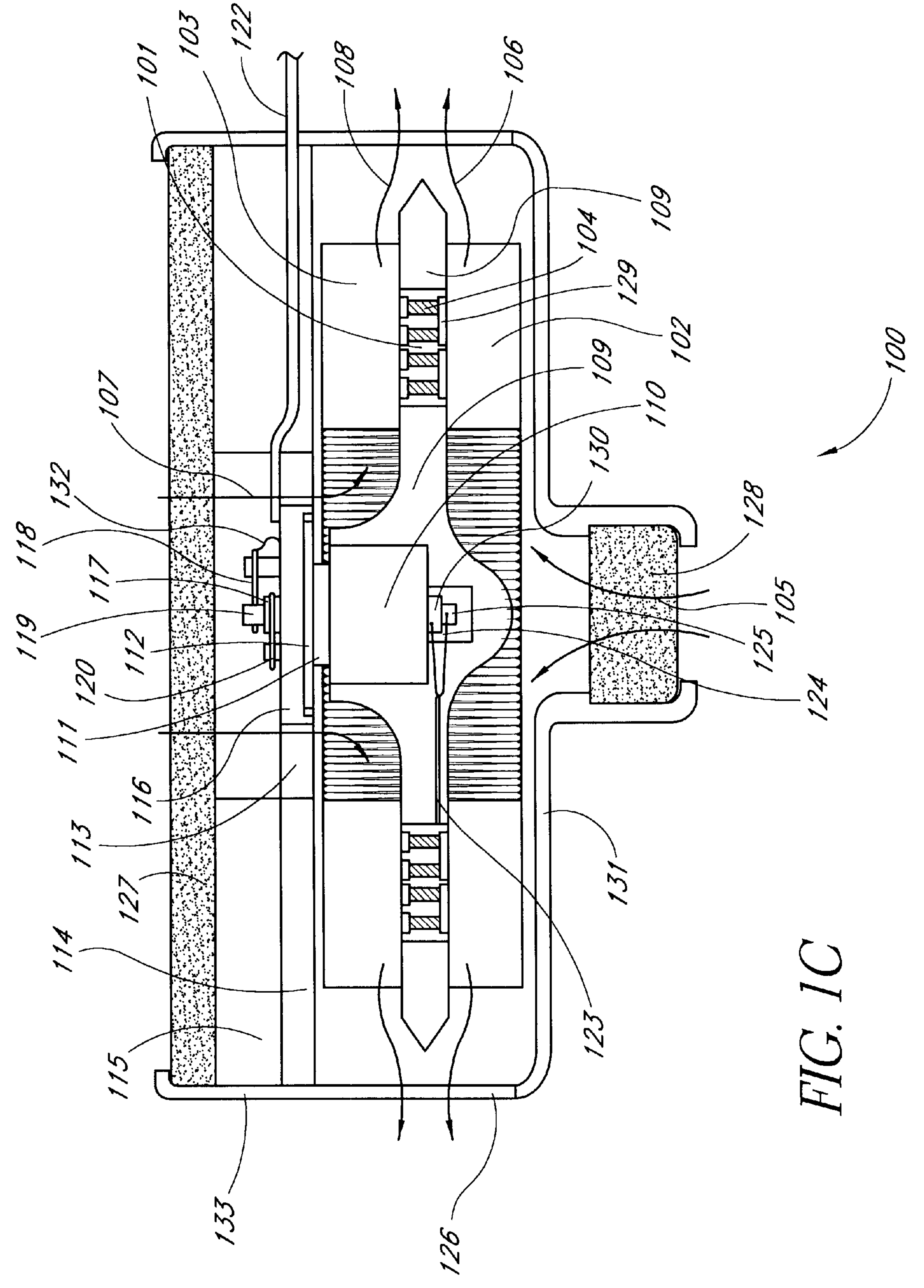
Figure 1D:
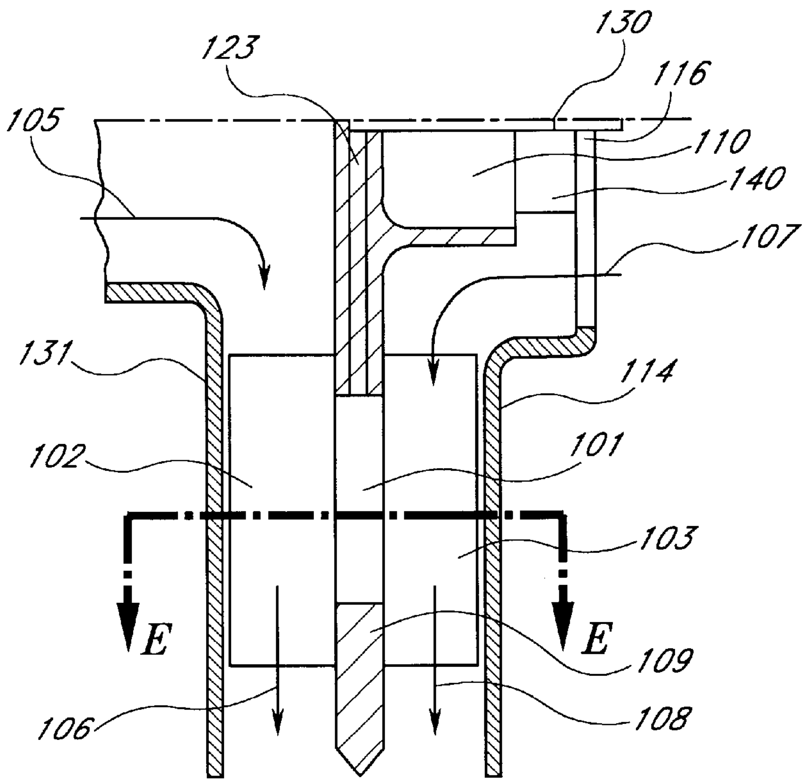
FIG. 1D–1F provide additional detail for various portions of the generator.
Figure 1E:
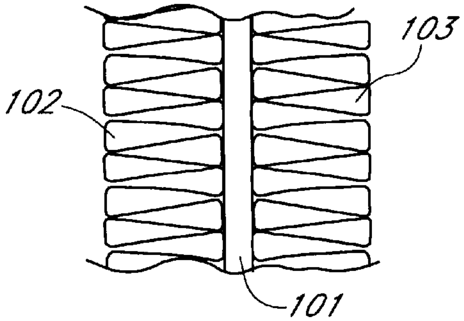
Figure 1F:
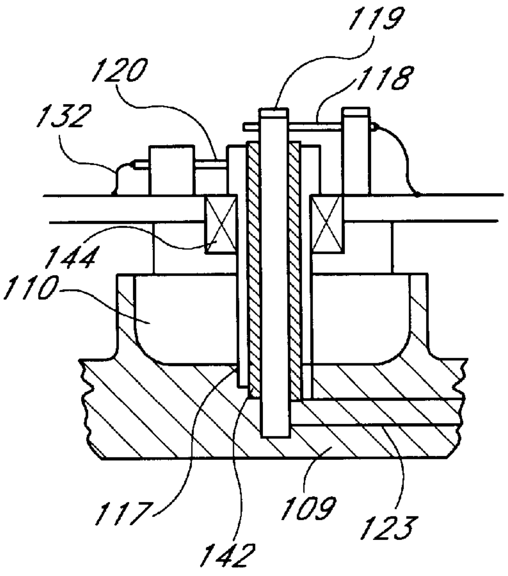

FIGS. 1A–1F depict a general arrangements for a rotary thermoelectric power generator 100. FIG. 1A is a perspective view. FIG. 1B is a view of a rotor assembly 135 as visible through the slots 126 of FIG. 1A. FIG. 1C is a cross section through the rotary thermoelectric power generator 100. FIGS. 1D–1F provide additional detail for various portions of the generator. A rotor assembly 135 (best seen in FIGS. 1B and 1C) is comprised of TE Module 101, in good thermal contact with hot side heat exchanger 102, such as heat transfer fins, on one side and a cold side heat exchanger 103, such as heat transfer fins, on the other. Insulation 109 separate hot and cold sides. Insulation 109 rigidly connects the rotor parts to a motor rotor 110. The TE Module 101 is depicted here for explanatory purposes and is comprised of TE elements 104 and circuitry 129. At contact points 124, 125, wires 123 electrically connect TE Module 101 to portions 117, 119 of shaft assembly 130 that are electrically isolated from each other, TE Module 101, hot side heat exchanger 102, cold side heat exchanger 103, insulation 107, 109, wiring 123, circuitry 129 and shaft portions 117, 119 all form a rigid rotatable unit.

Motor assembly 111 is connected to motor rotor 110 by bearings 144 (FIG. 1F). Slip ring contact 118 is in electrical communication with shaft member 119, and slip ring contact 120 is in electrical communication with shaft member 117. Wiring 122 connects to slip ring contacts 118 and 120 through circuitry 132 and other circuitry not shown, such as traces on a circuit board or other conventional circuit connections. Wiring 122 also connects to motor assembly 111, through a circuit board 112 and other circuitry not shown.

Spokes 113 (best seen in FIG. 1A) mechanically attach inner wall 114 (of FIG. 1 C) to motor base 116 and thereby to the motor assembly 111. Hot side fluid filter 128 is attached to outer housing 131, and cold side fluid filter 127 is supported by vanes 115 and attached to an extension 133 of outer housing 131. Openings 126 in the outer housing, such as slots, allow fluid 106, 108 passage through outer housing 131. A hot working fluid 105, 106 (FIGS. 1C and 1D) is confined to a chamber defined by outer wall 131, openings 126, insulation 109, filter 128 and TE Module 101. Cold working fluid 107, 108 is confined by inner wall 114, vanes 115, outer housing extension 133, motor base 116 and filter 127.

Hot fluid 105 passes through the hot side filter 128 and transfers heat to the hot side heat exchanger 102. The interface between the hot side heat exchanger 102 and TE Module 101 is thus heated. Similarly, cold fluid 107 passes through cold side filter 127 and absorbs heat from cold side heat exchanger 103. Thus, the interface between the cold side heat exchanger 103 and TE Module 101 is cooled. The temperature gradient (heat flow) across the TE Module 101 generates electrical power. The electrical power is transferred through wires 123, to conduct points 124, 125, to shaft portions 117, 118 and through slip ring contacts 118, 120 and to wires 122 (best seen in FIG. 1F).

Motor assembly 111 acting on motor rotor 110 spins the rotor assembly. In one embodiment, the heat exchangers 102, 103 are configured as fins oriented longitudinally away from the axis of rotation of the rotor assembly. In this configuration, the heat exchangers 102, 103 advantageously act as fan blades of a centrifugal fan or blower and thereby continuously pump working fluids 105, 107 in order to maintain a temperature differential across TE Module 101. A portion of the heat flow across TE Module 101 is continuously converted to electrical power. Hot working fluid 105 is cooled as it passes through the hot side heat exchanger 102 and exits as waste fluid 106 through openings 126. Similarly, cold working fluid 107 is heated as it passes through cold side heat exchanger 103 and exits as waste fluid 108 through openings 126.

The benefits of this rotational thermoelectric power generator will be explained in detail with specific configurations for the rotary assembly 135 in the following figures. The rotation of the heat exchanger thermoelectric module as a unit allows one or more heat exchangers to be used as fan blades for pumping the working fluid. In addition, other benefits and uses for rotation may be obtained in increasing the efficiency of the power generation system and increasing power density, as further explained below.

FIG. 1D depicts a closer view of cold and hot side working fluid movements for the power generator 100. The TE Module 101 is in good thermal communication with the hot side heat exchanger 102 and a cold side heat exchanger 103. The two sides are separated by insulation 109. Hot side fluid 105 and 106 is contained by an outer wall 131 and insulation 109. Similarly, cold side fluid 107, 108 is contained by the inner wall duct 114 and insulation 109. Motor rotor 110 is rigidly attached to insulation 109 so that insulation 109, TE Module 101 and heat exchangers 102, 103 move as a unit. Wires 123 connect TE Module 101 to rotary slip rings 118, 120 as described in more detail in the discussion of FIG. 1F. Motor rotor 110 is connected through bearings 144 (FIG. 1F) to motor driver 140 and shaft 130 (shown in detail in FIG. 1F). Electrical wires 123 connect to TE Module 101 and shaft 130.

A temperature gradient is produced across TE Module 101 by hot fluid 105 heating heat exchanger 102 and cool fluid 107, cooling heat exchanger 103. Hot fluid 105 cools and exits and cool fluid 107 is heated and exits. The movement of hot fluid 105 is created by the rotation of heat exchanger 102 componentry which act as vanes of a blower or radial fan. Motor rotor 110 and motor driver 140 produce the rotation. Fluid flow is guided by the outer housings and the insulation.

FIG. 1E shows a cross section of TE Module 101 and heat exchangers 102, 103. Heat exchangers 102, 103 are shown as folded fins as is known to the art, but may be of any other suitable heat exchanger design, as an example, any advantageous designs found in Kays, William M., and London, Alexander L., *Compact Heat Exchangers, 3rd Edition,* 1984, McGraw-Hill, Inc. Heat pipes and any other technology may be incorporated to enhance heat transfer.

FIG. 1F illustrates additional details of an embodiment of a slip ring assembly for transferring the electric power created TE Module 101 to external systems. The assembly consists of wires 123 in insulation 109, one of which is electrically connected to inner shaft 119, and a second to outer shaft 117. Electrical insulation 142 mechanically connects inner and outer shafts 117, 119. Advantageously, outer shaft 119 is mechanically connected to motor rotor 110 and bearing 144. Slip ring contact 118 is electrically connected to inner shaft 119 and slip ring contact 120 is electrically connected to outer shaft 117.

Figure 1G:
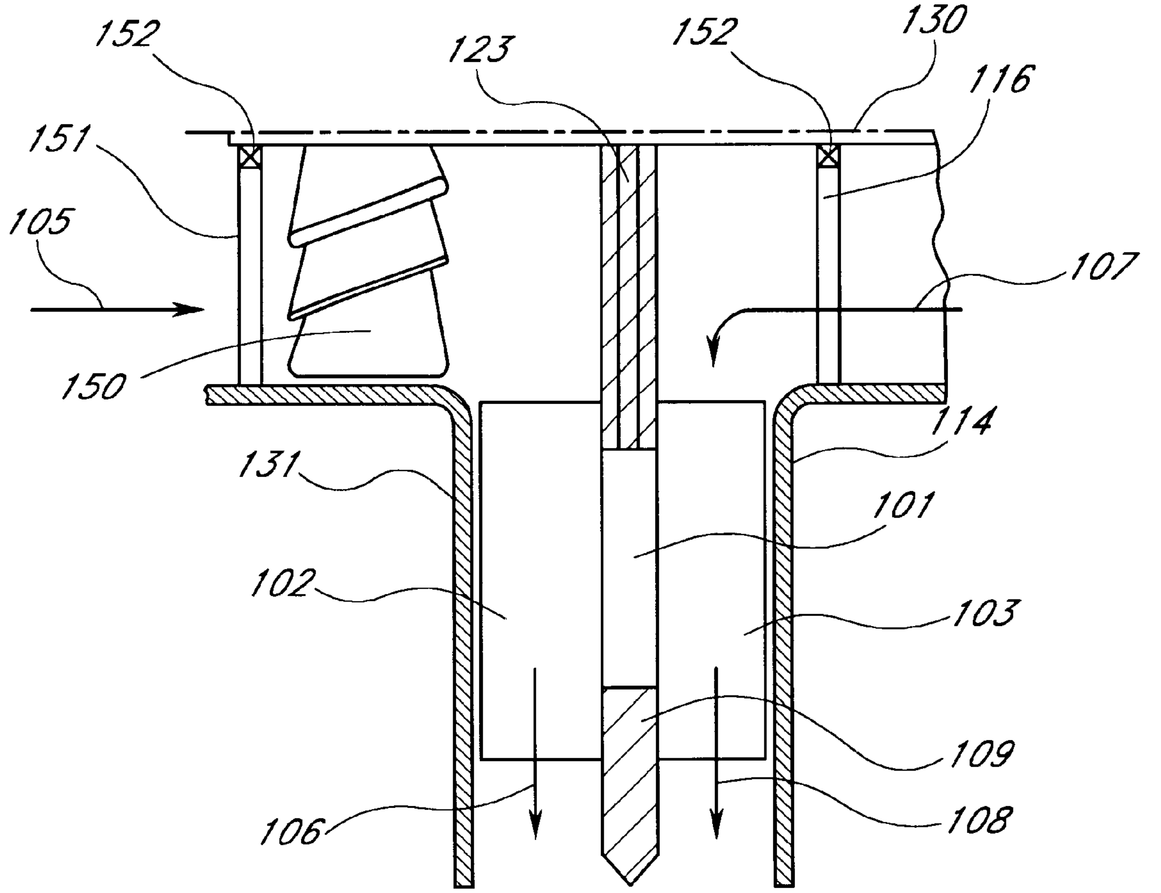
FIG. 1G further depicts a general arrangement of a thermoelectric generator in which the flow and pressure of a working fluid spins the generator assembly, thus eliminating the need for the electric motor shown in FIGS. 1C and 1D

FIG. 1G depicts an alternate configuration of a thermoelectric generator that uses flow and pressure of a working fluid to spin the generator assembly, thus eliminating the need for the electric motor shown in FIGS. 1C and 1D.

As depicted in FIG. 1G, the TE 101, heat exchangers 102, 103 and related parts comprising the rotatable parts of the thermoelectric generator are as identified in FIG. 1D, except that a fan 150 and insulation 109 are attached to form a rotatable unit. Bearings 152, shaft 130, and spokes 116, 151 form the suspension for the rotatable parts.

In operation, working fluid 105 propels fan 150. Power from the fan spins the rotatable parts. In this embodiment, the rotation acts to draw in cold working fluid 107, as well as provide other benefits from rotation discussed in the description of FIGS. 2 to 7 and 9.

The fan 150 is shown as a separate part. The same function can be achieved by using other designs that have heat exchangers or yet other parts shaped and positioned as to utilize power available in the hotter, colder and/or exhaust fluid streams to cause rotation. For Example, such a system could be used in the exhaust stream of a combustion engine, such as with an automobile. In such an example, what would otherwise simply be waste heat, is converted to electricity, and the exhaust flow spins the rotary thermoelectric assembly.

Motor rotor 110, insulators 109, 142, and shafts 117, 119 rotate as a unit and are supported by bearing 144. Slip rings 118, 120 transmit the electrical power produced within the rotating unit to an external electrical circuit. The slip rings 118, 120 can be of any design known to the art, and the shafts 117, 119 can be of any viable configuration that are conductive or contain conductive wires or members. The electrical power transmission parts and configuration can be of any design that conveys power from the rotating unit to external circuitry.

It should be understood that although FIG. 1 depicts a single rotary assembly, multiple rotary assemblies are also contemplated.

Figure 2A:
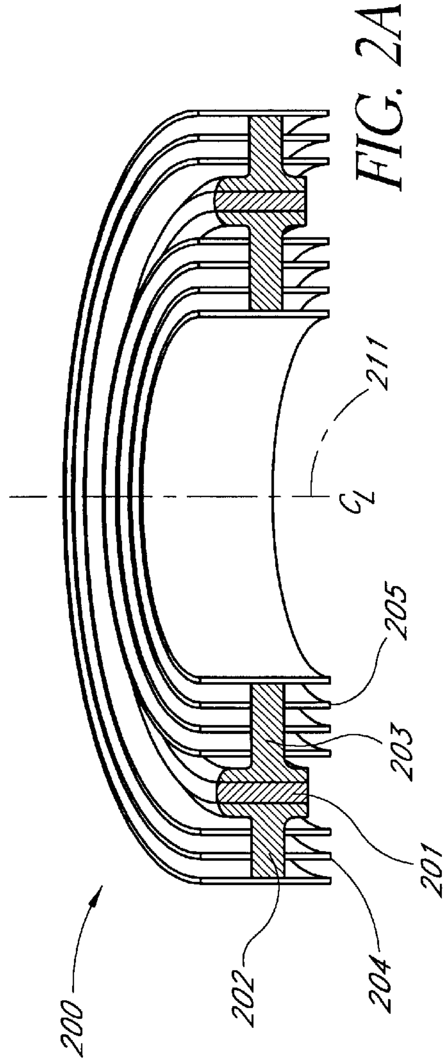
FIG. 2A depicts a TE Module, heat pipes and heat exchanger assembly for generally axial fluid flow in a rotary solid-state power generator.

FIG. 2A depicts a cross-sectional view of rotor assembly 200 for a thermoelectric power generator of the form illustrated generally in FIG. 1. The rotor assembly 200 consists of a ring-shaped TE Module 201 in good thermal contact with a circular array of outer heat pipes 202 and a circular array of inner heat pipes 203. A hot side heat exchanger 204 is in good thermal contact with outer heat pipes 202, and a cold side heat exchanger 205 is in good thermal contact with inner heat pipes 203. The rotor assembly 200 is generally symmetrical about its axis of rotation 211.

In operation, the rotor assembly 200 spins about its axis of rotation 211. Hot fluid (not shown) is in contact with the hot side heat exchanger 204, which transfers heat flux to the outer heat pipes 202, and to the outer surface of the TE Module 201. A portion of the heat flux is converted to electrical power by the TE Module 201. The waste heat flux passes through the inner heat pipes 203, then to the cool side heat exchanger 205 and finally to a cooling fluid (not shown) in contact with the cool side heat exchanger 205.

Figure 2C:
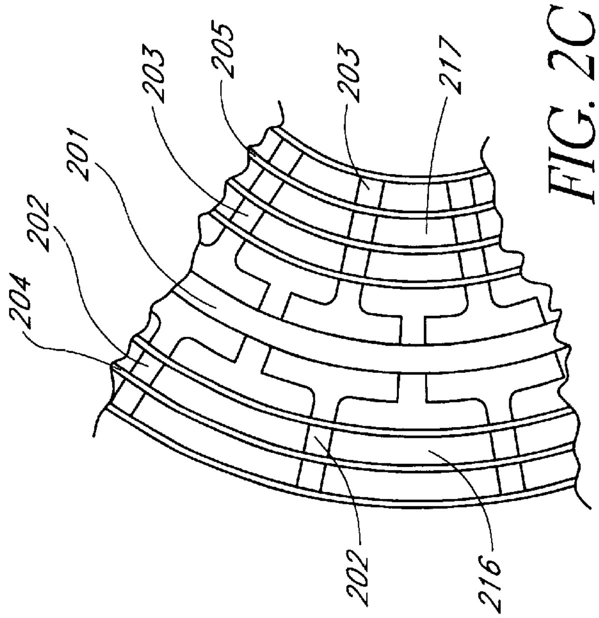
FIG. 2B gives a detailed cross sectional view of the assembly of FIG. 2A FIG. 2C gives a second view of a segment of the assembly of FIG. 2A.
Figure 2B:
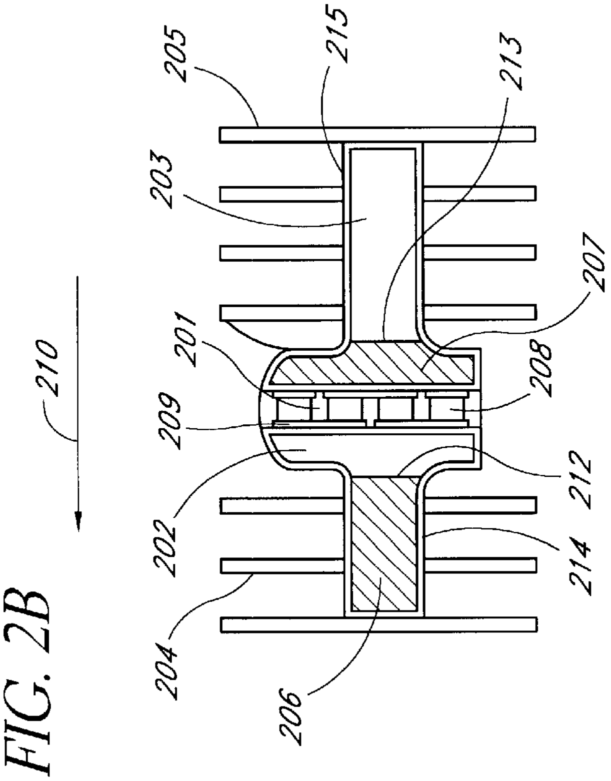

FIG. 2B presents a more detailed view of a cross-section of rotor assembly 200 through a heat pipe. As in FIG. 2A, the heat pipes 202 and 203 are in thermal contact with TE Module 201. The TE elements 208 and electrical circuitry 209 complete the TE Module 201. In one preferred embodiment, the heat pipes 202, 203 are comprised of sealed shells 214, 215 containing a heat transfer fluid. In operation, while the rotor assembly 200 spins about the axis 211, the rotational forces push a liquid phase of heat transfer fluid away from the axis of rotation of the particular heat pipes 202, 203. The direction of the outward force induced by rotation is shown by arrow 210. For example, in the heat pipe 202, a liquid phase 206 forms an interface 212 with the vapor phase. The hot side heat exchanger 204 is in good thermal contact with the hot side heat pipe shell 214. Similarly, the cool side heat pipes 203, 215, have heat transfer fluid 207 in a liquid phase and an interface 213 with the vapor phase. The cooler side heat exchanger 205 is in good thermal communication with the cool side heat pipe shells 215.

The outward force 210 induced by rotor assembly 200 rotation acts to force the liquid phases 206 and 207 to the positions shown in FIG. 2B. Hot gas (not shown) transfers heat from the outer heat exchanger fins 204 to outer heat pipe shells 214. The heat flux causes a portion of the liquid phase 206 on the hot side to vaporize. The vapor moves inward in the opposite direction to that indicated by arrow 210, since it is displaced by denser liquid phase 206. Vapor phase fluid in heat pipes 202 in contact with the interface of TE Module 201 and hot side heat pipe shells 214 transfers a portion of its heat content to the TE Module 201, and condenses to the liquid phase. The rotation-induced force drives the dense liquid-phase in the direction indicated by the arrow 210. The fluid cycle repeats as more heat is absorbed by the hot side heat exchanger 204, transferred to the outer heat pipe shells 214, and then to the outer surface of TE Module 201.

Similarly, waste heat from the inner side of TE Module 201 causes the liquid phase 207 of the inner heat pipe fluid to boil and be convected inward to the inner portions of the inner heat pipe shells 215. The cold working fluid (not shown) removes heat from the cooler side heat exchanger 205, and adjacent portions of cooler side heat pipe shells 215. This causes condensation of the fluid 207. The liquid phase is driven by centrifugal force in the direction indicated by the arrow 210, and accumulates against the TE Module 201 and the inner heat pipe shells 215 interface. This cycle constantly repeats, with the fluid constantly evaporating at one location, condensing at another, and being transported back to the first by centrifugal force.

The forces produced by the rotor assembly 201 rotation can be several times to thousands of times that of gravity, depending on rotor dimensions and rotational speed. Such centrifugal forces can enhance heat pipe heat transfer, thus allowing the rotor assembly 200 to operate with less heat transfer losses and at higher heat fluxes.

FIG. 2C shows a sectional view of the rotor assembly 200 of FIG. 2A viewed along the axis of rotation 211. The TE Module 201 is in good thermal contact with the outer heat pipes 202 and the inner heat pipes 203. The heat exchangers 204,205, such as fins as shown, are in good thermal contact with the heat pipes 202, 203.

FIG. 2C shows individual heat pipe segments 202, 203 and the TE Module 201. The hot working fluid (not shown)

flows through passages 216 between the outer heat exchanger fins 204 and the outer heat pipes 202. Similarly, the cold working fluid (not shown) flows through the inner passages 217 between the inner heat exchanger fins 205 and the inner heat pipes 203.

FIG. 3 depicts an alternative thermoelectric power generator rotor assembly 300, in which, working fluids flow in a generally radial direction. The cross section view shows a disk-shaped TE Module 301 in good thermal contact with hot side heat pipes 302 and cold side heat pipes 303. In good thermal contact with the hot side heat pipes 302 is a heat exchanger 304, and with the cooler side heat pipes 303 is a cool side heat exchanger 305. The rotor assembly 300 rotates about and is generally symmetrical about a centerline 310.

In operation, the rotor assembly 300 spins about the centerline 310, driven by a motor such as in FIG. 1. Hot working fluid (not shown) passing generally radially outward between the hot side heat exchanger 304 (fins in this depiction) and the hot side heat pipes 302, transfers heat to the heat exchanger 304 and the outer heat pipes 302 and then to the TE Module 301. Similarly, cold working fluid (not shown) passing generally radially outward through the center side heat exchanger 303 and the cooler side heat pipes 305 removes heat convected by the cooler side heat pipes 303 from the TE Module 301. A portion of the thermal flux passing from the hotter side heat pipes 304 to the TE Module 301 and out through the cooler side heat pipes 305 is converted by TE Module 301 to electric power.

Rotation of the heat pipes 302, 303 (configured as flattened tubular sections in this embodiment) advantageously act as fan blades that pump hot and cold working fluids (not shown) outward. Advantageously, the heat exchangers 304, 305 and the heat pipes 302, 303 are configured to maximize both heat transfer and fan fluid pumping action. Thus, the rotor assembly 300 functions both as the power generator and working fluid pump.

Figure 3A:
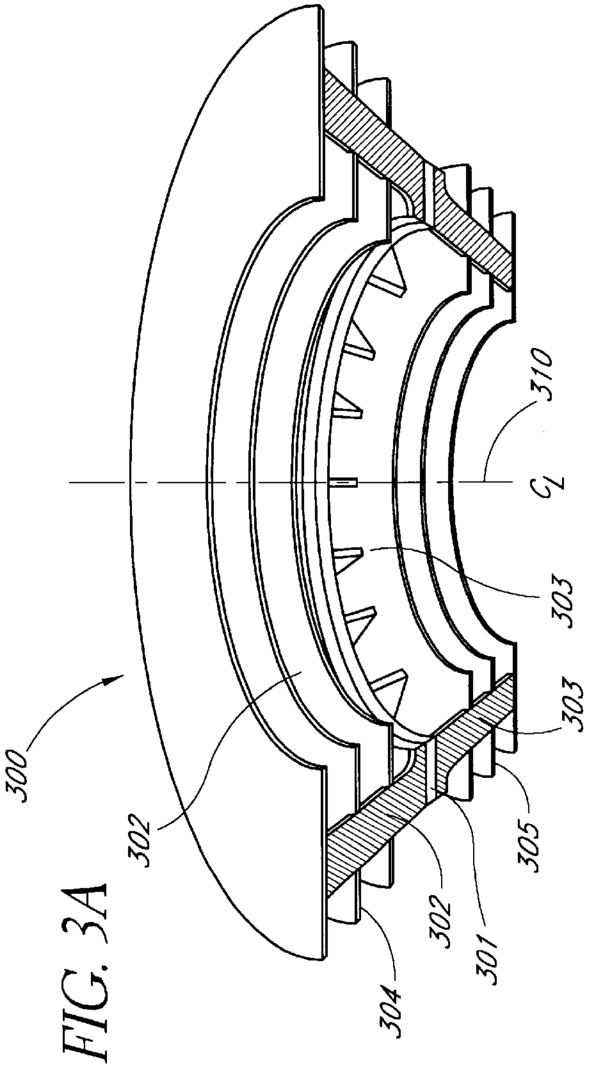
FIG. 3A depicts a sectional view of a TE Module, heat pipes and heat exchanger assembly for generally radial fluid flow in a rotary power generator.
Figure 3B:
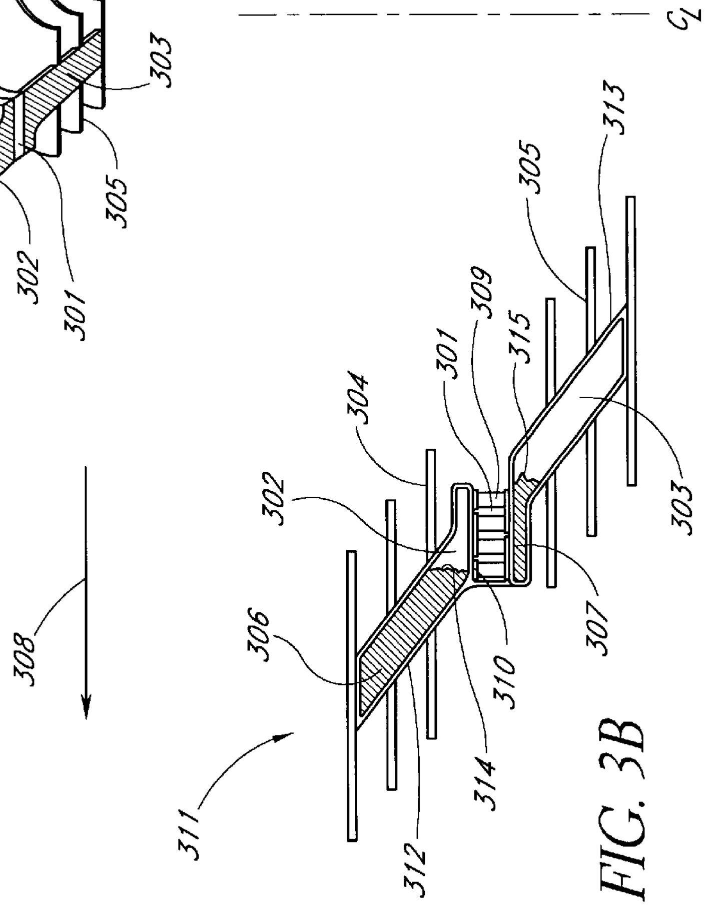
FIG. 3B shows a detailed, cross-sectional view of the assembly of FIG. 3A.

FIG. 3B shows a more detailed, cross-sectional view 311 through a heat pipe of the rotor assembly 300 depicted in FIG. 3A. The TE Module 301 is comprised of TE elements 309 and circuitry 310. The TE Module 301 is in good thermal contact with heat pipes 302, 303. As with the FIG. 2 configuration, the hotter side heat pipes 302 are comprised of sealed shells 312 with a fluid having a liquid phase 306 and vapor phase, with an interface 314. Similarly, the cooler side heat pipes 303 are comprised of sealed shells 313, containing fluid with liquid phase 307 and vapor phase, with an interface 315. The heat exchanger fins 304, 305 are in good thermal communication with the heat pipes 302, 303. An arrow 308 points in the direction of an outward force generated as the rotary assembly rotates about the axis 310.

In operation, the outward forces push the liquid phases 306, 307 of the heat transfer fluids within the heat pipes 302, 303 outward, forming the liquid phases 306, 307 and the interfaces 314 and 315. Heat flux from the hot side working fluid (not shown) flowing past the hot side heat exchanger 304 evaporates portions of the fluid 306, which condenses at the hotter side heat pipe shells 312 at the TE Module 301 interface. Similarly, a portion of the heat flux passes through the TE Module 301 to its interface with cooler side heat pipe shells 313, and into the cooler side heat pipe fluid 307, causing the fluid 307 to boil. The vapor phase condenses on the inner portion of the cool side heat pipe shell 313 as heat is removed by transfer to the cooler side heat exchanger 305, and to the cooler side working fluid (not shown). This heat transfer process is analogous to that described in more detail in the descriptions of FIGS. 2A, 2B and 2C.

Figure 4:
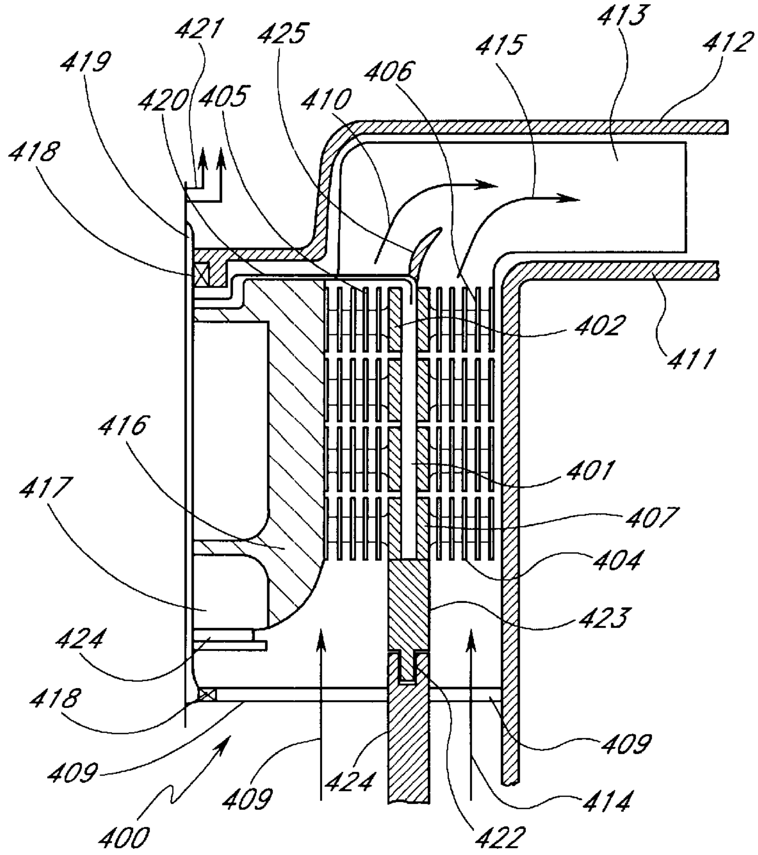
FIG. 4 depicts an axial flow power generator wherein the hot and cold fluids flow generally parallel to one another in the same general direction. The generator utilizes thermal isolation and heat pipes to improve energy conversion efficiency.

FIG. 4 depicts one side of another rotating power generator 400 in cross-section. A TE Module 401 is connected thermally to a cooler side heat exchanger 402 and a hotter side heat exchanger 403. In the depicted embodiment, the cooler side heat exchanger 402 has segments of heat pipes 404 and fins 406. Similarly, hotter side heat exchanger 403 has segments of heat pipes 405 and fins 407. A cooler working fluid 408, 410 is confined to a chamber formed by insulators 416, 423,424 and a duct 412. Similarly, a hotter working fluid 414 and 415 is confined by the insulators 423,424 and an outer duct 411. Rotor insulation 416 is connected rigidly to a motor rotor 417, the inner portion of the exchanger 402, and thereby to the TE Module 401 and heat exchanger 403. Wires 420 and a shroud 425 are connected rigidly to the TE Module 401. Similarly, a fan blade assembly 413 is rigidly attached to the TE Module 401. A shaft assembly 419 is attached to the motor rotor 417, and to bearings 418. A slip ring assembly 421 is in electrical communication to a shaft assembly 419. The insulators 423 and 424 are configured to form a labyrinth seal 422. Spokes 409 connect the left most bearing 418 to insulation 424 and to duct 411.

The assembly formed by the motor rotor 417, the insulators 416,423, the heat pipes 402, 403, the TE Module 401, the fan blades 413, the wires 420, the shaft 419 and the shroud 425 rotate as a unit. Rotation of the fan blades 413 provides motive force for the hot and the cold working fluids 408, 410, 414, 415.

The hot working fluid 414 enters from the left and transfers thermal energy to the hot side heat exchanger 402 and then, to TE Module 401. The flow of the hot working fluid 414 is driven by the rotation of the fan blades 413. Similarly, the cooler working fluid 408 enters from the left and extracts waste thermal energy from the cooler side heat exchanger 403 and the TE Module 401. The electrical power created passes through the wires 420 and out of the rotating portion through the shaft assembly 419 and the slip ring assembly 421, as was described in more detail in the discussion of FIG. 1F.

The heat pipes 402,403 are segmented to thermally isolate one portion from another for the purposes taught in U.S. patent application Ser. No. 09/844,818 filed Apr. 27, 2001, entitled Improved Efficiency Thermoelectrics Utilizing Thermal Isolation, which application is incorporated by reference herein. Heat transfer within the heat pipes 402, 403 is enhanced by the centrifugal acceleration as discussed above, and thereby, increases efficiency of thermal power transport and the allowable power density at which the system can operate. By utilizing centrifugal force to enhance the heat transfer, the overall device can be more compact and employ thermoelectric materials that advantageously operate at high thermal power densities.

The seal 422 is representative of any seal configuration that suitably separates hot fluid 414 from cold fluid 408 with a moving to stationary boundary. In some configurations, the pumping power of the fan 413 in combination with the inlet geometry may negate the need for the seal 422. Alternately, seal 422 may serve the function of providing separation of the hotter and cooler working fluids 408, 422 if an external, alternate mechanism (not shown) to fan blades 413 provides the force to pump the working fluids 408, 422 through the heat exchangers 402, 403. In such an embodiment, the fan 413 may be omitted or its function supplemented by an alternate fluid pump mechanism.

Figure 5:
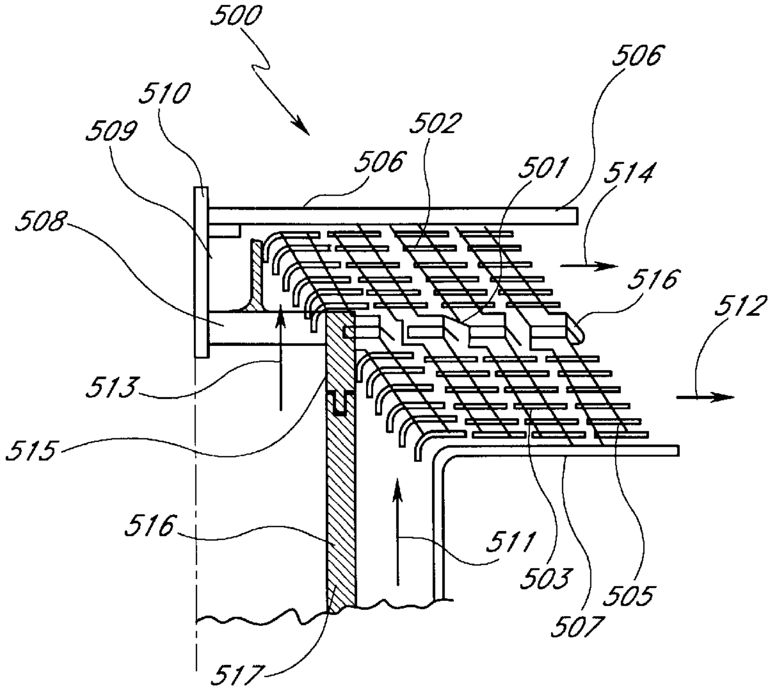
FIG. 5 depicts a radial flow power generator wherein the hot and cold fluids flow generally parallel to each other in the same direction. The generator utilizes thermal isolation and heat pipes to improve efficiency.

FIG. 5 depicts a power generator configuration in which the heat exchangers act as fan blades. The TE Module and heat exchanger are similar in concept to the configuration depicted in FIG. 3. The rotor assembly 500 consists of TE Modules 501, cooler fluid heat exchanger 502, a hotter fluid heat exchanger 503, insulation 515,517, spokes 508 and a motor rotor 509, all of which are connected rigidly to one another to form a rigid unit that rotates about a shaft 510. The cooler fluid heat exchanger 502 has heat pipes in good thermal contact with fins 504. Similarly, the hotter fluids heat exchanger 503 has heat pipes in good thermal contact with fins 505. Insulation 515, 517 and a duct 507 form a chamber that confines a hotter working fluid 511,512. Similarly, insulation 515, 517 and a duct 506 form a chamber, which confines a cooler working fluid 513, 514. A seal 516 is formed in the insulation 515, 517 to separate the hotter 511 and the colder working 513 fluids.

The assembly 500 operates by the motor rotor 509 providing motive force to rotate the heat exchangers 502, 503, which, in turn, creates a pumping action to pull hot and cold fluid through the heat exchangers 502, 503 to produce a temperature gradient across the TE Module 501. Electrical power generated thereby is extracted and transferred to external circuitry by the design shown in FIGS. 1A–1E, or by any other transfer method acceptable in the environment.

Advantageously, several working fluids may be used within a single assembly. A generator such as that of FIG. 4 may have several sources of hot side working fluids each with a different composition and/or temperature. This condition can arise, for example, with waste electrical power generation systems that have several sources of exhaust gas to be processed with waste heated fluid from a boiler, dryer or the like. Such multiple sources of working fluids may be introduced through wall 411 at a position along the axis of rotation where the hot side working fluid 422 has been cooled to a temperature that when combined with an added working fluid, advantageously generates electrical power. In this circumstance, the heat flux may vary in some of the heat pipes 402, 407 and fins 405, 409 so that TE Modules 101, heat pipes 402, 207 and fins 405, 409 may differ in their construction, size, shape, and/or materials from one section to the next in the direction of fluid flow. Also, insulation and fin structure can be used to separate different fluids. Finally, more than one cold side working fluid 409, 410 can be utilized in combination with at least one hot side working fluid.

Figure 6:
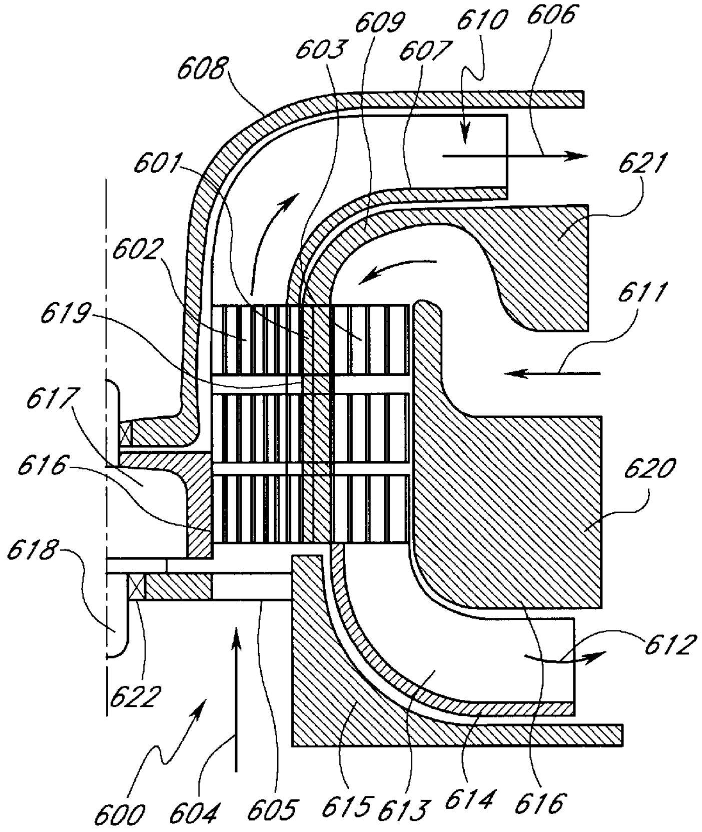
FIG. 6 depicts an axial flow generator with hot and cold fluids flowing in generally opposite directions to one another. Advantageously, the TE Modules and heat exchangers are thermally isolated to improve efficiency and increase power density.

The design of FIG. 6 also utilizes heat pipes as described in FIG. 4. The assembly 600 of FIG. 6 utilizes counter-flow as taught in U.S. patent application Ser. No. 09/844,818, which is incorporated by reference herein. FIG. 6 depicts a cross-section of yet another rotary thermoelectric power generator. Advantageously, this embodiment also utilizes thermal isolation. The generator assembly 600 has a rotating assembly formed of a TE Module 601, pairs of thermally isolated heat exchangers 602, 603, fan assemblies 610, 613 with shrouds 607, 614, insulation 615, 616, 619, 620, 624, a motor rotor 617 and a shaft assembly 618.

Hotter side working fluid 611,612 is confined by insulation 609, 615, 619, 620, 621. Cooler side working fluid 604,606 is confined by insulation 609, 615, 616, 619, 621, and a duct 608. Spokes 605 connect a bearing 622 to the insulation 615.

Cooler side working fluid 604 enters from the left, absorbs thermal power from heat exchangers 602, thereby cooling them, and is pumped radially outward by the centrifugal action of fan blades 610. The fan blades 610 may or may not contain an inner shroud 607 which can be employed to provide structural support and act as a partial seal to keep hotter working fluid 611 separate from the cooler working fluid 606, and help guide the cooler working fluid's 606 flow. The hotter working fluid 611 enters in a radially inward direction, conveys thermal power to hotter side heat exchangers 603 and then is pumped radially outward by the action of the rotating fan blades 613. The shroud 614 may be employed to add structural rigidity to the fan blades 613, act as a partial seal to separate cooler working fluid 604 from the exiting hotter working fluid 612, and help guide the hotter working fluid's 612 flow.

Figure 7:
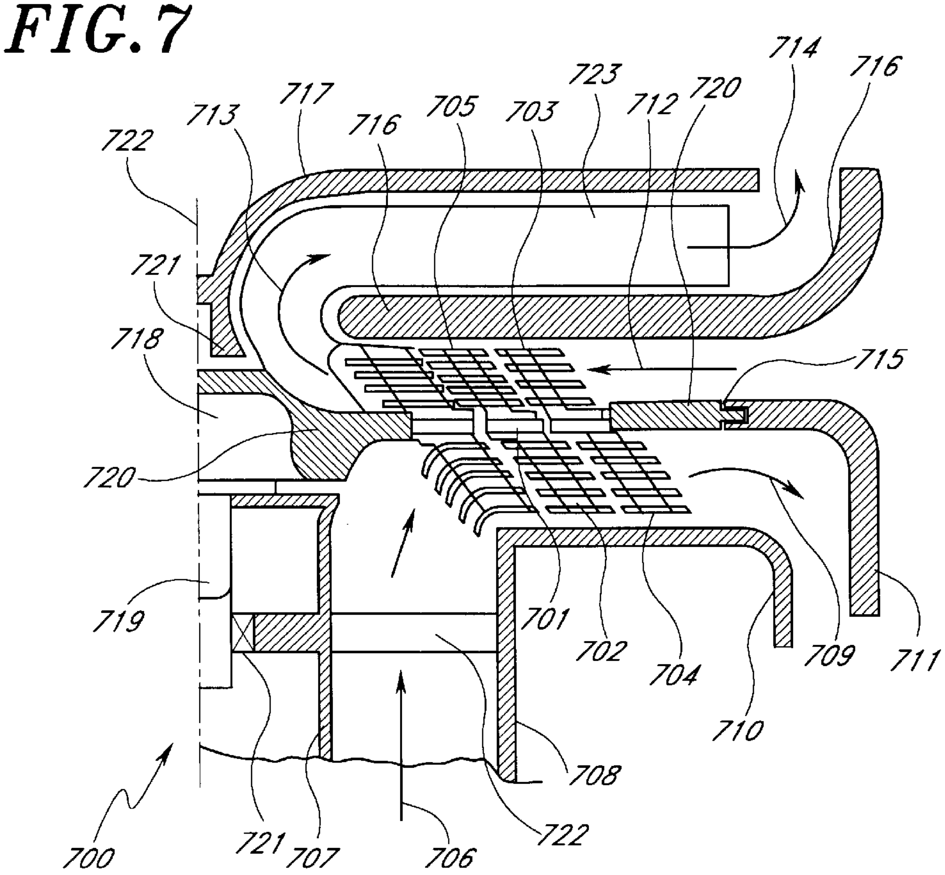
FIG. 7 depicts a radial flow generator with the hot and cold fluids flowing generally in opposite directions. Advantageously, the TE Modules are thermally isolated. Heat pipes are employed to both increase efficiency and power density.

FIG. 7 depicts a cross-section of yet another rotary thermoelectric power generator. The design of FIG. 7 is configured to operate in counter flow. The heat exchangers may or may not contain heat pipes to enhance heat transfer.

FIG. 7 depicts a radial flow power generator 700. A rotating assembly consists of a TE Module 701, heat exchangers 702,703, with fins 704, 705, insulation 720, fan blades 723, a motor rotor 718 and a shaft 719. Bearings 721 attach the shaft assembly 719 to a non-rotating duct 717 inner support 707, spokes 722 and a duct 710. The hotter working fluid 706,709 is confined by an inner support 707, the duct 710, insulation 720, the TE Module 701 and an exhaust duct 711. The cooler working fluid 712, 713, 714 is confined by exhaust ducts 711,716, insulation 720, the TE Module 701 and a duct 717. A seal 715 separates the hotter working fluid 709 from the cooler working fluid 712.

The assembly 700 operates using counter-flow of the same general type discussed in the description of FIG. 6. It operates in a generally radial direction with the hot side heat exchanger 702 with its fins 704 acting as rotating fan blades to pump hotter working fluid 706,709. Cooler working fluid 712, 713, 714 responds to the net effect of a radially outward force produced by heat exchanger heat pipes 703 and fins 704 and a larger radially outward force produced by the rotation of fan blades 723 acting on the cooler side working fluid 713,714. The net effect of the counteracting forces is to cause fluid 712, 713,714 to flow in the directions shown in FIG. 7. Since, the larger blade force is generated by the position of fan blades 723, being longer than, and extending radially outward farther than the heat exchangers 703 with its fins 705. Alternately, any portion of the fluids' 706, 709, 712, 713, 714 motion could be generated by external fans or pumps. In such configurations, the fan 723 may be, but need not be, deleted.

Electrical power is generated and transmitted by methods and design described in FIGS. 1 and 5–6, or any other advantageous way.

Figure 8:
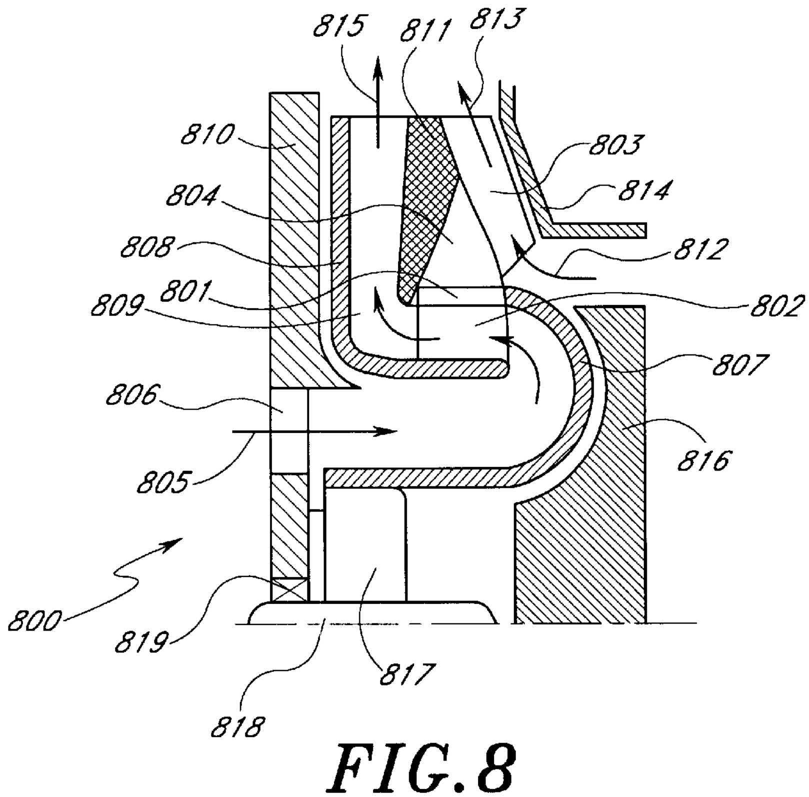
FIG. 8 depicts a power generator with both generally radial and axial flows. A solid conductive heat transfer member is utilized to transfer heat between the TE Module and the hot side fin.

FIG. 8 depicts a power generator that combines radial and axial geometries. The general arrangement 800 has a rotational portion consisting of a TE Module 801, heat exchangers 802,803, a thermal shunt 804, insulation 811, a fan assembly 808 and 809, a duct 807, a motor rotor 817 and a shaft assembly 818. Cooler working fluid 805,815 is confined by a shroud 807, insulation 811, a fan duct 808, and a wall 810. Hotter working fluid 812,813 is confined by a shunt 804, a shroud 807, insulation 811, 816 and a wall 814. A bearing 819 connects rotating shaft assembly 818 to spokes 806 and wall 810.

Operation is similar to that previously described in FIG. 7, except that the cooler working fluid 805 flows through heat exchanger 802 in a generally axial direction. As depicted herein, the thermal shunt 804 and the heat exchangers 802,803 may or may not contain heat pipes. Further, the heat exchangers 802, 803, the TE Module 801 and the thermal shunt 804 may or may not be constructed so as to be made up of thermally isolated elements as taught in U.S.

patent application Ser. No. 09/844,818, entitled Improved Thermoelectrics Utilizing Thermal Isolation, filed Apr. 27, 2001, which patent application is incorporated by reference herein.

Figure 9:
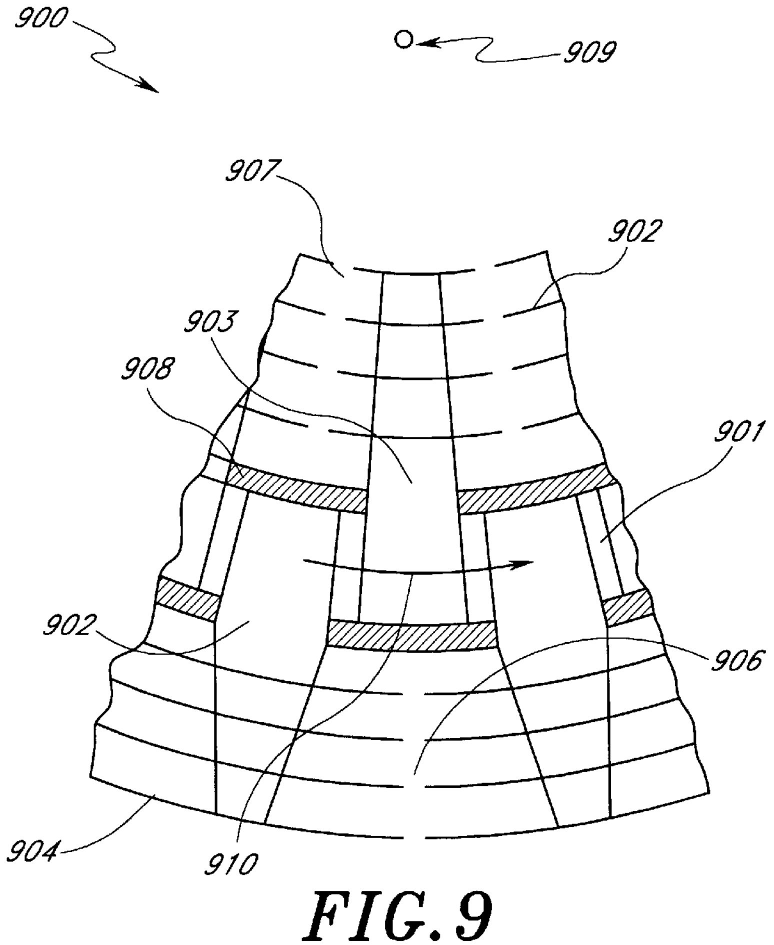
FIG. 9 depicts a portion of an axial flow power generator in which current flows through TE elements or modules and heat pipes in a circular direction about the axis of rotor rotation.

FIG. 9 depicts an integrated TE Module and heat exchanger. An assembly 900 is a segment of a ring-shaped array of TE Modules 901 with a center of rotation 909 a heat exchanger 902 with fins 904, heat exchanger 903 with fins 905 and thermal insulation 908. Gaps 906, 907 electrically isolate sections of the fins 904, 905 that are connected to the individual heat exchanger parts 902, 903. When operating, one heat exchanger 903, for example, is cooled and the other heat exchanger 902 is heated creating a thermal gradient across TE Modules 901. Electrical power is produced by the resultant heat flow.

In this configuration, the TE Modules 901 may be individual TE elements 901 with a current 910 flowing in a generally circular direction around the ring of which assembly 900 is a portion. In a portion where the TE Modules 901 are individual thermoelectric elements, for the current 910 to flow as shown, the elements 901 are alternately of N- and P-type. Advantageously, heat exchangers 902, 903 are electrically conductive in that portion between the adjacent TE elements 901. If the fins 904, 905 are electrically conductive and in electric contact with heat exchangers 902,903, adjacent fins must be electrically isolated from on another as indicated by gaps 906, 907. Electric power can be extracted by breaking the circular current flow at one or more locations and connecting, at the breaks, to electrical circuitry as discussed in FIG. 7.

Alternately, groups of elements can be between adjacent heat exchangers 903, 902, thus forming TE Modules 901. Such TE Modules 901 can be connected electrically in series and/or parallel and may have internal provisions for electrical isolation so that gaps 906, 907 are not needed. Thermal isolation between hot and cold sides may be maintained by insulation 1008.

If the heat exchangers 902,903 contain heat pipes, advantageously, working fluids cool the inner heat exchangers 903 and heat the outer heat exchangers 902.

Figure 10:
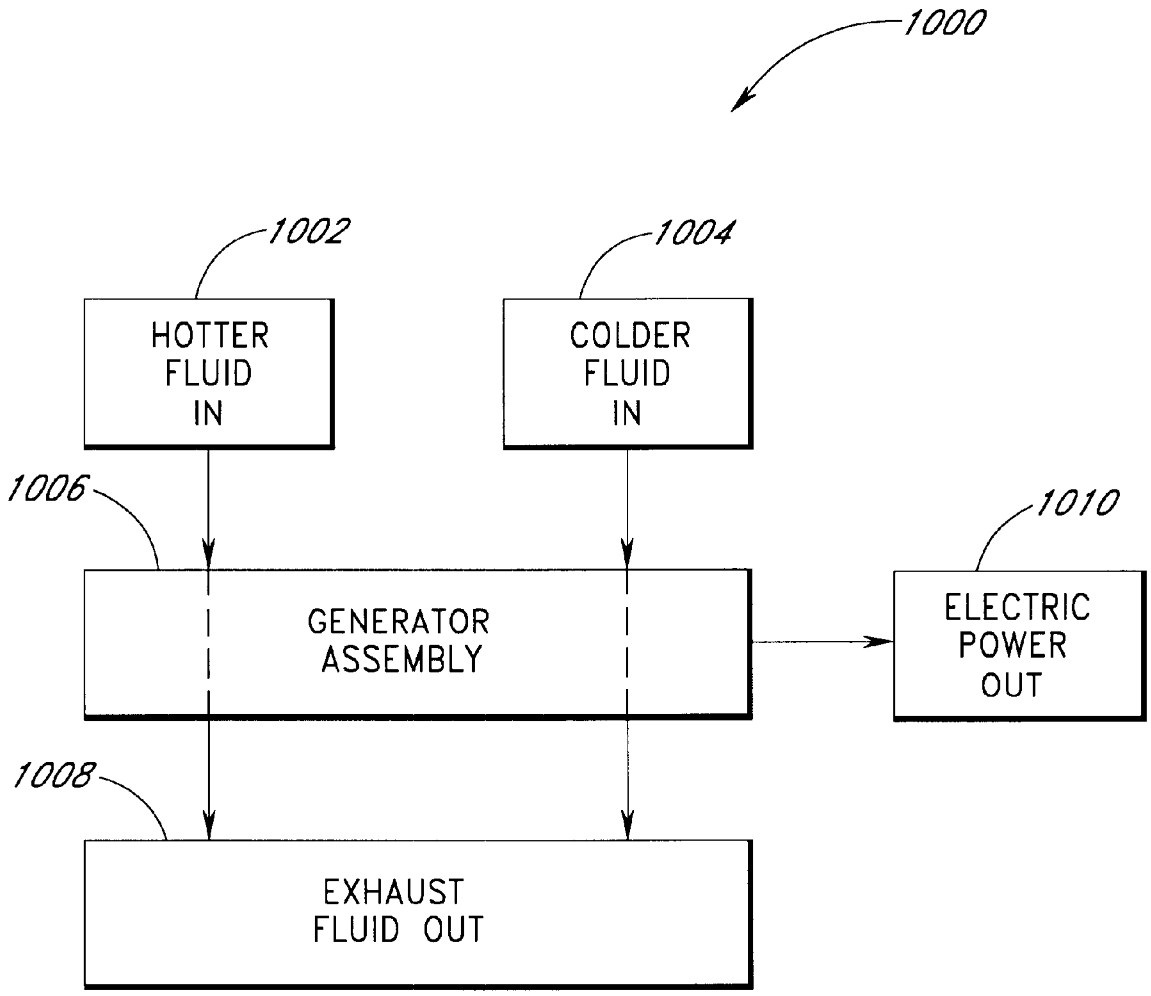
FIG. 10 depicts a system block diagram of a thermoelectric power generator.

FIG. 10 illustrates a block diagram of a thermoelectric power generator system 1000. As illustrated, the system has a hotter working fluid source 1002, a colder working fluid source 1004, a generator assembly 1006, exhaust fluid outputs 1008, and electrical power output 1010. The generator assembly 1006 is configured with any of the embodiments disclosed above, or any similar embodiment using the principals taught herein. A source of hotter fluid 1002 provide a heat source for the generator assembly 1006. A source of colder fluid 1004 provide a source of working fluid sufficiently cooler in temperature to create an advantageous temperature gradient across the thermoelectric in the generator assembly 1006. The waste working fluid exits the generator assembly at an output 1008. Electrical power from the generator assembly 1006 is provided at a power output 1010. This system 1000 is merely a generally exemplary system, and is not restrictive of the manner in which the generator assemblies of the present invention would be incorporated into a power generation system.

The individual teachings in this application may be combined in any advantageous way. Such combinations are part of this invention. Similarly, the teachings of U.S. application Ser. No. 09/844,818 entitled Improved Efficiency Thermoelectrics Utilizing Thermal Isolation, and U.S. application Ser. No. 09/971,539, entitled Thermoelectric Heat Exchanger related to rotary heat exchangers can be used in combination with this application to create variations on the teachings herein, and are part of this invention. For example, the heat exchangers of the hot and/or cold sides, in one embodiment, are configured in portions that are substantially thermally isolated from other portions of the heat exchanger. Similarly, portions of the thermoelectric module, in one embodiment, are thermally isolation from other portions of the thermoelectric module.

Accordingly, the inventions are not limited to any particular embodiment, or specific disclosure. Rather, the inventions are defined by the appended claims, in which terms are presented to have their ordinary and customary meaning.

What is claimed is:

1. A thermoelectric power generator comprising:

at least one rotary thermoelectric assembly having at least one thermoelectric module, wherein said at least one rotary thermoelectric assembly accepts at least one working fluid and converts heat from said working fluid into electricity.

2. The thermoelectric power generator of claim 1, wherein the at least one rotary thermoelectric assembly comprises at least one hotter side heat exchanger and at least one cooler side heat exchanger.

3. The thermoelectric power generator of claim 2, wherein at least the at least one hotter side heat exchanger comprises at least one hotter side heat pipe in thermal communication with the at least one thermoelectric module and a plurality of heat exchanger fins in thermal communication with the at least one hotter side heat pipe.

4. The thermoelectric power generator of claim 3, wherein at least the at least one cooler side heat exchanger comprises at least one cooler side heat pipe in thermal communication with the at least one thermoelectric module and a plurality of heat exchanger fins in thermal communication with the at least one cooler side heat pipe.

5. The thermoelectric power generator of claim 3, wherein the heat pipes contain a fluid, and wherein the heat pipes are oriented such that centrifugal force from the rotation of the rotary thermoelectric assembly causes a liquid phase of said fluid to gather in a portion in said heat pipes.

6. The thermoelectric power generator of claim 5, wherein the fluid in the cooler side heat pipes is in a liquid phase at at least a portion of an interface to the at least one thermoelectric module, and the fluid in the hotter side heat pipes is in a vapor phase at at least a portion of an interface to the at least one thermoelectric module.

7. The thermoelectric power generator of claim 2, wherein at least the at least one cooler side heat exchanger comprises at least one cooler side heat pipe in thermal communication with the at least one thermoelectric module and a plurality of heat exchanger fins in thermal communication with the at least one cooler side heat pipe.

8. The thermoelectric power generator of claim 7, wherein the heat pipes contain a fluid, and wherein the heat pipes are oriented such that centrifugal force from the rotation of the at least one rotary thermoelectric assembly causes a liquid phase of said fluid to gather in a portion in said heat pipes.

9. The thermoelectric power generator of claim 2, further comprising a motor coupled to the rotary thermoelectric assembly to spin said at least one rotary thermoelectric assembly.

10. The thermoelectric power generator of claim 9, wherein spinning the at least one rotary thermoelectric assembly pumps the working fluid through and/or across at least one of the heat exchangers.

11. The thermoelectric power generator of claim 1, wherein the least one working fluid spins the at least one thermoelectric assembly.

12. The thermoelectric power generator of claim 11, wherein the at least one hotter side heat exchanger comprises at least one hotter side heat pipe in thermal communication with the at least one thermoelectric module and a plurality of heat exchanger fins in thermal communication with the at least one hotter side heat pipe.

13. The thermoelectric power generator of claim 12, wherein the heat pipes contain a fluid, and wherein the heat pipes are oriented such that centrifugal force from the rotation of the at least one rotary thermoelectric assembly causes a liquid phase of said fluid to gather in a portion in said heat pipes.

14. The thermoelectric power generator of claim 11, wherein at least one cooler side heat exchanger comprises at least one cooler side heat pipe in thermal communication with the at least one thermoelectric module and a plurality of heat exchanger fins in thermal communication with the at least one cooler side heat pipe.

15. The thermoelectric power generator of claim 14, wherein the heat pipes contain a fluid, and wherein the heat pipes are oriented such that centrifugal force from the rotation of the at least one rotary thermoelectric assembly causes a liquid phase of said fluid to gather in a portion in said heat pipes.

16. The thermoelectric power generator of claim 1, wherein the at least one rotary thermoelectric assembly comprises a plurality of thermoelectric modules, at least some of the thermoelectric modules thermally isolated from at least some other of the thermoelectric modules.

17. The thermoelectric power generator of claim 1, wherein the at least one rotary thermoelectric assembly comprises at least one hotter side heat exchanger, wherein said hotter side heat exchanger has a plurality of portions substantially thermally isolated from other portions of the hotter side heat exchanger.

18. The thermoelectric power generator of claim 1, wherein the at least one working fluid rotary thermoelectric assembly further accepts a cooler working fluid to remove waste heat.

19. A method of generating power with at least one thermoelectric assembly having at least one thermoelectric module, said method comprising the steps of:

rotating the at least one thermoelectric assembly;

passing at least one first working fluid through and/or past a first side of the at least one thermoelectric assembly to create a temperature gradient across the at least one thermoelectric module to generate electricity; and communicating the electricity from the at least one thermoelectric module.

20. The method of claim 19, further comprising passing at least one second working fluid through and/or past a second side of the at least one thermoelectric assembly.

21. The method of claim 19, wherein the at least one thermoelectric assembly has at least one first side heat exchanger and at least one second side heat exchanger, said step of passing the at least one first working fluid comprising passing the at least one first working fluid through and/or past the first and/or second side heat exchanger.

22. The method of claim 21, wherein at least the at least one first side heat exchanger comprises at least one first side heat pipe in thermal communication with the at least one thermoelectric module and a plurality of heat exchanger fins in thermal communication with the at least one first side heat pipe.

23. The method of claim 22, wherein the heat pipes contain a fluid, and wherein the heat pipes are oriented such that centrifugal force from the rotation of the at least one thermoelectric assembly causes a liquid phase of said fluid to gather in a portion in said heat pipes.

24. The method of claim 22, wherein at least the at least one second side heat exchanger comprises at least one second side heat pipe in thermal communication with the at least one thermoelectric module and a plurality of heat exchanger fins in thermal communication with the at least one second side heat pipes.

25. The method of claim 24, wherein the heat pipes contain a fluid, and wherein the heat pipes are oriented such that centrifugal force from the rotation of the at least one thermoelectric assembly causes a liquid phase of said fluid to gather in a portion in said heat pipes.

26. The method of claim 25, wherein the fluid in the second side heat pipes is in a liquid phase at at least a portion of an interface to the at least one thermoelectric module, and the fluid in the first side heat pipes is in a vapor phase at at least a portion of an interface to the at least one thermoelectric module.

27. The method of claim 19, wherein a motor coupled to the at least one thermoelectric assembly rotates said thermoelectric assembly.

28. The method of claim 19, wherein the step of rotating the at least thermoelectric assembly pumps the at least one first working fluid through and/or across the heat exchangers.

29. The method of claim 19, wherein the at least one thermoelectric assembly comprises a plurality of thermoelectric modules, the method further comprising the step of substantially thermally isolating at least some of the thermoelectric modules from at least some other of the thermoelectric modules.

30. The method of claim 19, wherein the at least one thermoelectric assembly comprises at least one first side heat exchanger, and wherein said first side heat exchanger has a plurality of portions, said method further comprising the step of substantially thermally isolating some of said plurality of portions from other of said plurality of portions of the first side heat exchanger.

31. The method of claim 19, wherein said step of rotating comprises at least using the at least one first working fluid to spin the at least one thermoelectric assembly.

32. A thermoelectric power generation system comprising:

a source of at least one hotter working fluid;

a source of at least one cooler working fluid;

at least one rotary thermoelectric assembly having at least one thermoelectric module, wherein said rotary thermoelectric assembly accepts the at least one hotter working fluid and converts heat from the hotter working fluid into electricity;

an exhaust for said at least one hotter and said at least one cooler working fluids; and at least one electrical communication system to transfer said electricity from said rotary thermoelectric assembly.

33. The thermoelectric power generation system of claim 32, wherein the at least one rotary thermoelectric assembly comprises at least one hotter side heat exchanger and at least one cooler side heat exchanger.

34. The thermoelectric power generation system of claim 32, wherein at least the at least one hotter side heat exchanger comprises at least one hotter side heat pipe in thermal communication with the at least one thermoelectric module and a plurality of heat exchanger fins in thermal communication with the at least one hotter side heat pipe.

35. The thermoelectric power generation system of claim 34, wherein at least the at least one cooler side heat exchanger comprises at least one cooler side heat pipe in thermal communication with the at least one thermoelectric module and a plurality of heat exchanger fins in thermal communication with the at least one cooler side heat pipe.

36. The thermoelectric power generation system of claim 35, wherein the heat pipes contain a fluid, and wherein the heat pipes are oriented such that centrifugal force from the rotation of the rotary thermoelectric assembly causes a liquid phase of said fluid to gather in a portion in said heat pipes.

37. The thermoelectric power generation system of claim 35, wherein the fluid in the cooler side heat pipes is in a liquid phase at at least a portion of an interface to the at least one thermoelectric module, and the fluid in the hotter side heat pipes is in a vapor phase at at least a portion of an interface to the at least one thermoelectric module.

38. The thermoelectric power generation system of claim 32, further comprising a motor coupled to the at least one rotary thermoelectric assembly to spin said rotary thermoelectric assembly.

39. The thermoelectric power generation system of claim 38 wherein spinning the at least one rotary thermoelectric assembly pumps the at least one hotter working fluid through and/or across the hotter side heat exchangers.

40. The thermoelectric power generation system of claim 32, wherein the at least one rotary thermoelectric assembly comprises a plurality of thermoelectric modules, at least some of the thermoelectric modules thermally isolated from at least some other of the thermoelectric modules.

41. The thermoelectric power generation system of claim 32, wherein the at least one rotary thermoelectric assembly comprises at least one hotter side heat exchanger, wherein said hotter side heat exchanger has a plurality of portions substantially thermally isolated from other portions of the hotter side heat exchanger.

42. The thermoelectric power generation system of claim 32, wherein the at least one rotary assembly further accepts a cooler working fluid to remove waste heat.

43. The thermoelectric power generation system of claim 32, wherein at least the hotter and/or the cooler working fluids spin the rotary thermoelectric assembly.

* * * * *